(12) United States Patent
Seller

(10) Patent No.: US 8,675,789 B2
(45) Date of Patent: Mar. 18, 2014

(54) RECEIVER WITH VARIABLE GAIN ELEMENTS AND AUTOMATIC GAIN CONTROL TO MAINTAIN A POSITIVE SIGNAL TO NOISE RATIO MARGIN

(75) Inventor: Olivier Seller, Auribeau sur Siagne (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/454,005

(22) Filed: Apr. 23, 2012

(65) Prior Publication Data
US 2013/0279556 A1  Oct. 24, 2013

(51) Int. Cl.
*H04L 27/08* (2006.01)
*H03K 9/00* (2006.01)

(52) U.S. Cl.
USPC .......................................... 375/345; 375/316

(58) Field of Classification Search
USPC .................................. 375/345, 316
See application file for complete search history.

(56) References Cited

U.S. PATENT DOCUMENTS

| | | | |
|---|---|---|---|
| 4,876,737 A * | 10/1989 | Woodworth et al. | ........ 455/12.1 |
| 2003/0162518 A1 | 8/2003 | Baldwin et al. | |
| 2006/0034401 A1 * | 2/2006 | Cho et al. | ...................... 375/345 |
| 2007/0076783 A1 | 4/2007 | Dishman et al. | |
| 2008/0014894 A1 * | 1/2008 | Manku et al. | .................. 455/318 |
| 2009/0207767 A1 * | 8/2009 | Hirsch | ........................... 370/311 |
| 2011/0149773 A1 | 6/2011 | Lee et al. | |
| 2012/0057621 A1 * | 3/2012 | Hong et al. | .................... 375/219 |

FOREIGN PATENT DOCUMENTS

WO    2006099530 A2    9/2006

OTHER PUBLICATIONS

Search Report for GB Application 1301811.4 dated May 24, 2013.

* cited by examiner

*Primary Examiner* — Chieh M Fan
*Assistant Examiner* — Brian J Stevens
(74) *Attorney, Agent, or Firm* — Frommer Lawrence & Haug LLP; Matthew M. Gaffney

(57) ABSTRACT

A receiver comprising: one or more variable gain elements; an automatic gain control (AGC) for controlling a gain of one or more of the one or more the variable gain elements; and a frame detector configured to detect the presence of a frame in a signal received by the receiver and to output a signal to the AGC on detection of a data frame, wherein the AGC is configured to estimate a signal to noise ratio (SNR) of the received signal on receiving an input signal from the frame detector, to calculate a SNR margin between the estimated SNR and a target SNR and to adjust the gain of one or more of the one or more variable gain elements to maintain a positive SNR margin such that in the event of interference with the received signal the one or more variable gain elements do not saturate.

9 Claims, 1 Drawing Sheet

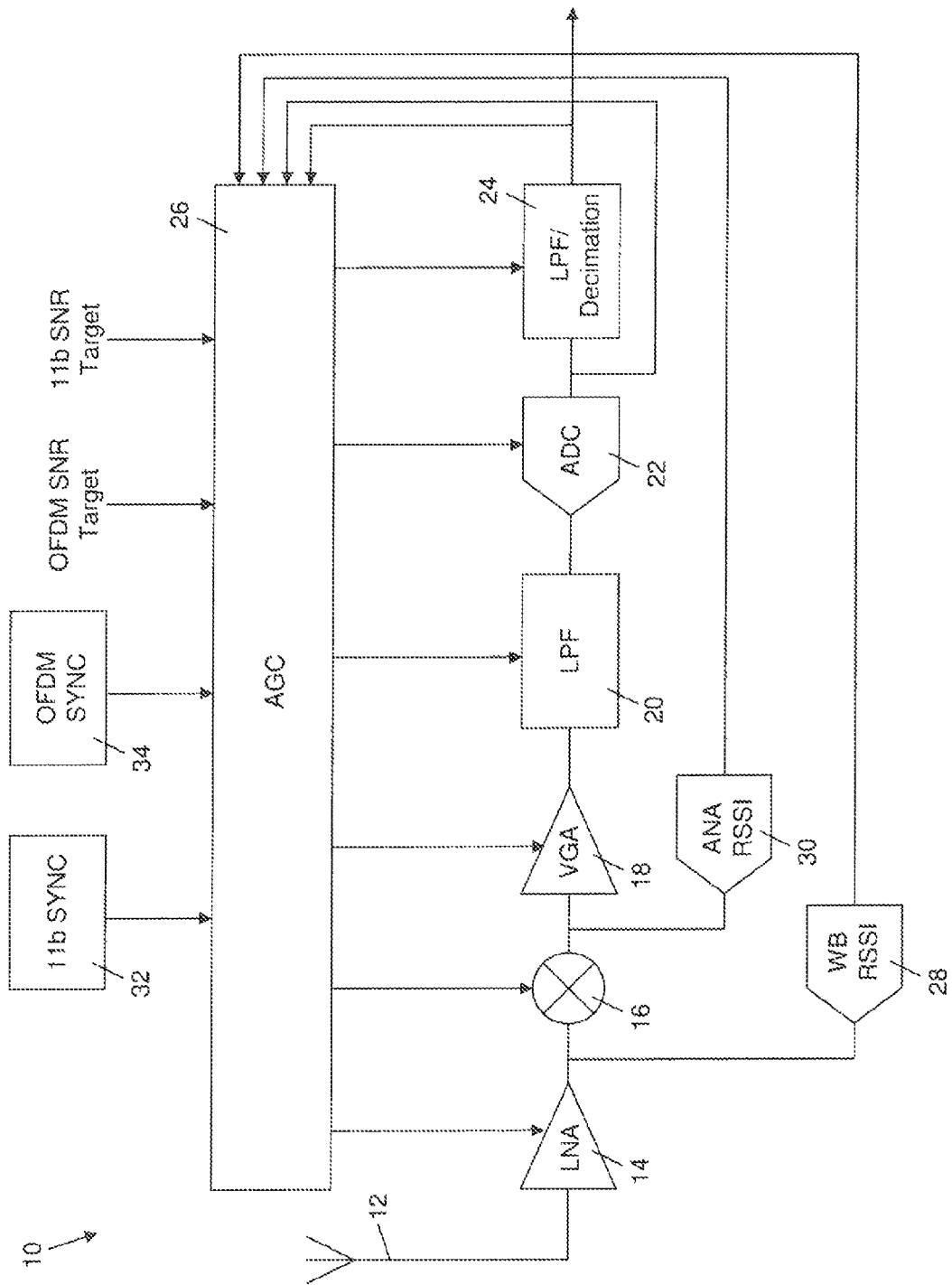

RECEIVER WITH VARIABLE GAIN ELEMENTS AND AUTOMATIC GAIN CONTROL TO MAINTAIN A POSITIVE SIGNAL TO NOISE RATIO MARGIN

TECHNICAL FIELD

The present application relates to a receiver.

BACKGROUND TO THE INVENTION

A receiver for use in a telecommunications systems typically comprises a number of different elements, such as a low noise amplifier (LNA), a mixer and a baseband filter, each of which has variable gain and selectivity. In receivers of this type an automatic gain control (AGC) is typically used to set the gains of different elements of the receiver, such that none of the components saturates when a signal is received, whilst also ensuring that the quality of the signal at an output of the receiver is high enough to permit demodulation/decoding of the transmitted data contained in the received signal.

In some receivers, such as those operating in accordance with the IEEE802.11 (WiFi) standard, AGC hardware operates continuously, but is frozen shortly after the beginning of a data frame is received by the receiver. After this freeze of the AGC hardware, the gains of the components of the receiver can no longer be changed. However, interference may commence after the freeze of the AGC hardware, and this interference can cause saturation of elements of the receiver. This can lead to a situation in which the beginning of a data frame is correctly received (i.e. the transmitted data contained in the received data frame can be correctly demodulated/decoded), but the end of the data frame is not.

In such situations it is possible that setting the gains of the elements of the receiver to lower values would have permitted successful reception of the entire data frame. However, the AGC hardware has to set the gains of the elements to their maximum value to obtain good sensitivity at all data rates, and thus setting the gains of the elements to lower values, which might permit successful reception of more data frames in the face of interference, is not possible.

Typically known AGC hardware used in receivers of the type described above compensates for interference at the level of analogue to digital converters (ADCs) only. The received signal is scaled such that only part of the available dynamic range of an ADC in the receiver is used. In this way, any interference which appears in addition to the desired signal in the received signal does not saturate the ADC, since there is some "headroom" in the dynamic range of the ADC in which the interference can be accommodated. This is possible because there is a direct relationship between the number of output bits of an ADC and quantisation noise introduced by the ADC.

SUMMARY OF INVENTION

According to a first aspect of the invention there is provided a receiver comprising: one or more variable gain elements; an automatic gain control (AGC) for controlling a gain of one or more of the one or more the variable gain elements; and a frame detector configured to detect the presence of a frame in a signal received by the receiver and to output a signal to the AGC on detection of a data frame, wherein the AGC is configured to estimate a signal to noise ratio (SNR) of the received signal on receiving an input signal from the frame detector, to calculate a SNR margin between the estimated SNR and a target SNR and to adjust the gain of one or more of the one or more variable gain elements to maintain a positive SNR margin such that in the event of interference with the received signal the one or more variable gain elements do not saturate.

The variable gain elements may comprise a low noise amplifier and a mixer.

The variable gain elements may further comprise one or more of: a variable gain amplifier; a low pass filter; and an analogue to digital converter.

The receiver may be configured to enter a locked state when the frame detector detects the presence of a frame in a signal received by the receiver.

The receiver may be configured to adjust the gain value of one or more of the variable gain elements prior to entering the locked state.

The variable gain elements may comprise a low noise amplifier, and the receiver may be configured to adjust the gain value of the low noise amplifier prior to entering the locked state.

The AGC may be configured to estimate the SNR of the received signal based on: a received signal strength indicator (RSSI) of a signal output by the receiver for subsequent processing; an estimate of the total gain of the receiver; and an estimate of the noise figure of the receiver.

The receiver may be configured to receive signals transmitted in accordance with an IEEE802.11 standard.

The frame detector may comprise a synchroniser that is configured to detect a frame of a signal transmitted in accordance with the IEEE802.11b standard.

The frame detector may comprise a synchroniser that is configured to detect a frame of a signal transmitted using an OFDM modulation scheme.

The AGC may comprise a look-up table which stores gain values for the variable gain elements against indices.

The gain values stored in the look-up table may be indexed in order of increasing gain.

BRIEF DESCRIPTION OF THE DRAWINGS

Embodiments of the invention will now be described, strictly by way of example only, with reference to the accompanying drawing, FIG. 1, which is a schematic representation of a receiver architecture for a receiver which operates in accordance with the IEEE802.11 (WiFi) standard.

DESCRIPTION OF THE EMBODIMENTS

Referring first to FIG. 1, an architecture for a receiver that operates in accordance with the IEEE 802.11 standard is shown generally at 10. As will be appreciated by those skilled in the relevant art, the receiver architecture 10 is shown in FIG. 1 as being made up of functional blocks representing processing operations performed on a received signal, but these do not necessarily correspond directly to physical units that may appear within a practical implementation of a receiver. Additionally, FIG. 1 shows only those functional blocks that are necessary for an understanding of the principles of the present invention, whereas a practical implementation of a receiver may include additional functional blocks.

The receiver 10 illustrated in FIG. 1 is for receiving signals transmitted in accordance with the IEEE802.11 standard. In particular, the receiver may be configured to receive signals transmitted under the IEEE 802.11b standard, and the IEEE 802.11g standard, which uses an orthogonal frequency division multiplexing (OFDM) modulation scheme. However, it will be appreciated that the principles employed in the receiver 10 are equally applicable to other receiver that have high dynamic range, packetized (i.e. non-continuous) operation, variable data rate and potentially bursted interferers or blockers.

The receiver 10 includes an antenna 12 for receiving signals transmitted over a radio channel. A signal received by the antenna 12 is passed to a low noise amplifier (LNA) 14, which amplifies the received signal before outputting an amplified version of the received signal to a mixer 16.

The mixer 16 mixes the amplified version of the received signal with a signal generated by a local oscillator (not shown), to downconvert the signal received by the antenna 12 to baseband for subsequent processing in the receiver 10.

The downconverted signal output by the mixer 16 is input to a variable gain amplifier (VGA) 18 which amplifies the downconverted signal by an amount determined by the gain of the VGA 18, which is adjustable according to a required signal level, as will be explained in more detail below.

The amplified signal output by the VGA 18 is input to an analogue low pass filter (LPF) 20, which filters the amplified signal to attenuate signal components outside the frequency band of interest.

The filtered signal output by the LPF 20 is input to an analogue to digital converter (ADC) 22, which converts the analogue signal received by the antenna 12 and subsequently processed by the LNA 14, mixer 16, VGA 18 and LPF 20 into a digital signal which is decimated by a further low pass filter 24 which outputs a decimated digital signal for use in downstream processing operations such as demodulation and decoding to retrieve transmitted data from the received signal.

The LNA 14, mixer 16, VGA 18, LPF 20, ADC 22 and LPF 24 are all variable gain elements of the receiver 10, and the gain of these elements is controlled by an automatic gain control 26, which receives signals indicative of the received signal level at various points in the receiver and issues control signals to adjust the gain of one or more of the LNA 14, mixer 16, VGA 18, LPF 20, ADC 22 and LPF 24 in accordance with predefined target signal levels and signal to noise ratio (SNR) levels, as will be described below.

An input of an ADC 28 is connected to the output of the LNA 14, and converts the analogue wideband signal output by the LNA 14 into a digital signal, which is output by the ADC 28 to an input of the ACG 26, which uses this digital signal as a wideband received signal strength indicator (RSSI), that is to say an indication of the signal strength of the wideband signal received by the antenna 12 and amplified by the LNA 14.

An input of a further ADC 30 is connected to the output of the mixer 16. The further ADC 30 converts the analogue baseband signal output by the mixer into a digital signal, which is output by the ADC 30 to an input of the AGC 26. The AGC 26 uses this digital signal as an analogue RSSI, that is to say an indication of the signal strength of the baseband signal output by the mixer 16.

The AGC 26 receives further digital signals from the output of the ADC 22 and the LPF 24 at its inputs, which provide a digital indication of the strength of the signals output by the ADC 22 and the LPF 24 respectively. The digital signals received from the ADC 22, LPF 24 and ADCs 28 and 30 are used by the AGC 26 to determine the gain settings to be applied to the variable gain elements 14, 16, 18, 20, 22, 24 of the receiver 10.

The AGC 26 is configured with predefined target signal levels, which it compares to the signal level indications received from the ADC 22, LPF 24 and ADCs 28 and 30 to determine the gain settings to be applied to the variable gain elements 14, 16, 18, 20, 22, 24 of the receiver 10, as will be described in more detail below.

The AGC is also configured with predefined target signal to noise ratio (SNR) levels. In the example illustrated in FIG. 1, the AGC 26 is configured with target SNR levels for two possible modes of operation of the receiver 10, the first mode for receiving signals transmitted in accordance with the IEEE 802.11b standard, and the second mode for receiving IEEE 802.11 signals transmitted using an OFDM modulation scheme.

To enable operation in these two modes, the receiver 10 includes a first synchroniser 32, for detecting frames of a received signal that was transmitted in accordance with the IEEE 802.11b standard, and a second synchroniser 34, for detecting frames of a received signal that was transmitted under an IEEE 802.11 standard using an OFDM modulation scheme. The first synchroniser 32 and the second synchroniser 34 each have an output that is connected to an input of the AGC 26, such that the AGC 26 is able to detect when a frame of an IEEE 802.11b signal or an IEEE 802.11 OFDM signal is received.

The AGC 26 has two modes of operation. The first is a continuous mode, in which the signal levels determined by the AGC 26 (referred to below as the "measured signal levels") based on the digital signals received from the ADC 22, LPF 24 and ADCs 28 and 30 are compared to the predefined target signal levels by the AGC 26. If the measured signal levels do not meet the target signal levels, the ADC 26 issues command signals to one or more of the variable gain elements 14, 16, 18, 20, 22, 24 of the receiver 10 to increase or reduce their gains to cause the measured signal levels to meet (or at least to come closer to) the predefined target signal levels.

In one embodiment, the AGC 26 includes one or more look-up tables which store gain values for each of the variable gain elements 14, 16, 18, 20, 22, 24 against indices. For example, the AGC 26 may include a look-up table of gain values for the LNA 14, indexed in order of increasing gain (i.e. the gain value stored against index 1 in the look-up table is lower than the gain value stored against index 2), and a separate look-up table of gain values for the VGA 18, LPF 20 and ADC 22 indexed in order of increasing gain.

The AGC 26 stores the index of the gain value that is currently being used by each of variable gain elements 14. If the measured signal level at a particular element of the receiver 10 does not meet the predefined target for that element, e.g. if the measured signal level at the output of the LNA 14, as represented by the output of the ADC 28 does not meet the predefined target signal level for the output of the LNA 14, the AGC 26 adjusts the index for that element, retrieves the gain value associated with the new index from the look-up table, and issues a command to the element to cause it to adjust its gain to the gain value retrieved from the look-up table.

For example, if the measured signal level at the output of the LNA 14 is lower than the target signal level for the output of the LNA 14, the AGC 26 increases the index for the LNA 14 and retrieves the gain value associated with the increased index from the look-up table. The AGC 26 issues a command to the LNA 14 to cause the gain of the LNA 14 to be increased to the gain value retrieved from the look-up table based on the increased index.

Similarly if the measured signal level at the output of the LNA 14 is higher than the target signal level for the output of the LNA 14, the AGC 26 reduces the index for the LNA 14 and retrieves the gain value associated with the reduced index from the look-up table. The AGC 26 issues a command to the LNA 14 to cause the gain of the LNA 14 to be reduced to the gain value retrieved from the look-up table based on the reduced index.

When one of the first or second synchronisers 32, 34 detects a frame, the AGC 26 enters a locked state, in which the gains of the variable gain elements 14, 16, 18, 20, 22, 24 of the receiver 10 are not changed. However, before the AGC enters this locked state, it performs certain actions to implement a signal to noise ratio margin by adjusting the gains of one or more of the variable gain elements 14, 16, 18, 20, 22, 24 of the receiver 10, to prevent saturation of the variable gain elements 14, 16, 18, 20, 22, 24 of the receiver 10 in the event that interference is received during reception of a frame by the receiver 10. This overcomes the problem in existing receivers that the beginning of a data frame is correctly received (i.e. the transmitted data contained in the received data frame can be correctly demodulated/decoded), but the end of the data frame is not.

The AGC 26 performs a fine measurement of the signal levels at the various different points in the receiver 10, by evaluating the signals received at its inputs from the ADC 22, the LPF 24 and the ADCs 28, 30. The first and second synchronisers 32, 34 are configured to detect a periodic preamble contained in a received signal to identify the received signal as an IEEE 802.11 signal. As the preamble is periodic, the total energy in the preamble is constant over one period.

The AGC 26 measures the signal levels received at its inputs over one or more periods, and selects gain values for each of the variable gain elements 14, 16, 18, 20, 22, 24 to implement a more even distribution of the total gain of the receiver 10 over the variable gain elements 14, 16, 18, 20, 22, 24.

First, the gain of the LNA 14 is adjusted, if the difference between the measured signal level and the target signal level is higher than the gain step provided by the LNA 14. Then the gain of the mixer 16 is adjusted based on the same criterion, taking into account the selected adjustment to the gain of the LNA 14 (since gain changes propagate through the receiver architecture). For example, an increase in the gain of the LNA 14 will affect the signal level at the mixer 16, such that if, based on the measured signal strength at the AGC 26, the AGC 26 determines that a gain step of +6 dBm is required at both the LNA 14 and the mixer 16, only the gain of the LNA 14 is increased to meet this requirement, as in doing so the requirement for a gain step at the mixer 16 will also be met, due to the propagation of the gain change of the LNA 14 through the receiver architecture.

The AGC 26 issues commands to the variable gain elements 14, 16, 18, 20, 22, 24 to set their gains to the new values determined by the AGC 26, and the AGC 26 stores the indices of the gain values for each of the variable gain elements 14, 16, 18, 20, 22, 24. The new gain values are referred to below as the "gain values at lock"

The AGC 26 then estimates a signal to noise ratio margin between the predefined SNR target and an estimated SNR of the received signal, as will be described below.

The signal level of the received signal is estimated based on the gain values at lock used by each of the variable gain elements 14, 16, 18, 20, 22, 24 of the receiver 10 and the signal strength indicator received by the AGC 26 from the output of the decimation LPF 24. The gain values at lock used by each of the variable gain elements 14, 16, 18, 20, 22, 24 are retrieved from the look-up table(s) using the indices stored by the AGC 26, and these gain values are multiplied together to generate an estimate of the total gain of the receiver 10. The signal strength indicator from the output of the decimation LPF 24 is divided by this total gain estimate, to generate an estimate of the signal level of the signal received at the antenna 12. Although the calculations above have been described as multiplications and divisions, in practice they will be performed by the AGC 26 using a logarithmic scale, to simplify the calculations, since in the logarithmic scale addition and subtraction operations replace multiplications and division operations.

A noise figure for the signal output by the decimation filter 24 is used in the estimation of the SNR of the received signal. This noise figure depends mainly on the gain values at lock of the LNA 14 and the mixer 16, and so the gain values at lock of the LNA 14 and the mixer 16 are retrieved by the AGC 26 from the look-up table(s) using the relevant indices. Based on these gain values, the AGC 26 retrieves from a look-up table an estimate of the noise figure at the time that the AGC 26 entered its locked mode.

Once the signal level and the noise figure estimates have been obtained, an estimate of the signal to noise ratio of the received signal is calculated by the AGC 26 based on the estimated signal level, noise figure and constants that depend on the absolute gain of the receiver 10 and signal bandwidth, as described below.

In a logarithmic scale, the SNR in dBm is equal to the input signal level in dBm minus thermal noise in dBm minus the noise figure of the receiver in dBm, i.e.

$$SNR = \text{signal in} - \text{thermal noise} - \text{noise figure}.$$

Thermal noise is a constant for a given receiver configuration, and this constant depends on the bandwidth of the signal following digital decimation by the decimation filter 24. Thermal noise is also proportional to absolute temperature (in Kelvin), and so it is possible for the AGC 26 to compensate for temperature, variations in determining the SNR.

The input signal level is equal to the wideband RSSI as received from the ADC 28 for the received signal, minus the total gain of the receiver architecture, plus a constant value, i.e.

$$\text{signal in} = RSSI - \text{gain} + \text{constant}.$$

The constant in this equation is used to compensate for the difference in units between the RSSI and the gain value. Thus, $$SNR = RSSI - \text{gain} + \text{constant} - \text{thermal noise} - \text{noise figure}.$$

The calculated SNR estimate is compared by the AGC 26 to the predefined SNR target for the relevant reception mode (802.11b or 802.11 OFDM) of the receiver to calculate an SNR margin. To do this the AGC 26 subtracts the SNR target from the SNR estimate, thereby generating the SNR margin.

To be able to receive any frame in the relevant reception mode after the AGC 26 has entered its locked mode whilst still meeting the SNR target, the SNR margin must be greater than zero. To better accommodate any interference that commences after the AGC 26 has entered its locked mode, the gain of the LNA 14 and of the mixer 16 should be as low as possible. The SNR margin is used to tune the trade-off between SNR level and accommodation of potential interference.

To this end, the AGC 26 performs a search to identify a gain index that corresponds to a reduced gain value for the LNA 14 and/or the mixer 16 that will result in a reduced SNR for the receiver and thus a reduced SNR margin, whilst retaining a positive SNR margin. Once a suitable gain index is identified, a gain command is sent by the AGC 26 to the LNA 14 and/or the mixer 16 to set the gain to the corresponding gain value. The amount of gain reduction applied to the LNA 14 and mixer 16 is compensated by an increase in the gain of the subsequent variable gain elements 18, 20, 22, 24. The design of the receiver 10 is such that it is always possible to compensate such a gain reduction in the RF section (the LNA 14 and mixer 16) with a gain increase in the baseband section (the VGA 18, LPF 20, ADC 22 and LPF 24).

This reduction in the gain value of the LNA 14 and/or the mixer 16 has the effect of protecting the variable gain components 14, 16, 18, 20, 22, 24 from saturation in the event that an interfering signal commences after the AGC has entered its locked mode, since the reduction in the gain of the LNA 14 and/or of the mixer 16 reduces the effect of the increased signal level at the antenna 12 resulting from the presence of the interfering signal, such that the variable gain components 14, 16, 18, 20, 22, 24 are able to accommodate the increased signal level at their inputs without saturating.

As the LNA 14 is the first element in the receiver 10 and has a greater effect on the SNR of the receiver 10 than the mixer 16, the AGC 26 may be configured to perform a search to identify a gain index that corresponds to a reduced gain value for the LNA 14 before performing such a search for the mixer 16, such that the gain of the LNA 14 is adjusted before any adjustment is made to the gain of the mixer 16.

The use of the SNR of the receiver 10 as a metric for the AGC 26 in this way reduces the susceptibility of the receiver 10 to interference that commences part way through reception of a frame of an IEEE 802.11 signal, whilst ensuring that the SNR of the receiver meets the predefined target SNR, or is as high as possible when signal level is low.

The invention claimed is:

1. A receiver comprising:
   one or more variable gain elements comprising a low noise amplifier;
   an automatic gain control (AGC) for controlling a gain of one or more of the one or more variable gain elements; and
   a synchroniser configured to detect the presence of a frame in a signal received by the receiver and to output another signal to the AGC on detection of the frame,
   wherein the AGC is configured to estimate a signal to noise ratio (SNR) of the received signal on receiving said another signal from the synchroniser, to calculate a SNR margin between the estimated SNR and a target SNR and to adjust the gain of one or more of the one or more variable gain elements to maintain a positive SNR margin such that in the event of interference with the received signal the one or more variable gain elements do not saturate, and wherein the receiver is configured to adjust the gain and then enter a locked state upon the detection of the frame in the received signal by the synchroniser.

2. A receiver according to claim 1 wherein the one or more variable gain elements further comprise a mixer.

3. A receiver according to claim 2 wherein the variable gain elements further comprise one or more of: a variable gain amplifier; a low pass filter; and an analogue to digital converter.

4. A receiver according to claim 1 wherein the AGC is configured to estimate the SNR of the received signal based on:
   a received signal strength indicator (RSSI) of a signal output by the receiver for subsequent processing;
   an estimate of the total gain of the receiver; and
   an estimate of the noise figure of the receiver.

5. A receiver according to claim 1, wherein the receiver is configured to receive signals transmitted in accordance with an IEEE802.11 standard.

6. A receiver according to claim 1 wherein the synchroniser is configured to detect a frame of a signal transmitted in accordance with the IEEE802.11b standard.

7. A receiver according to claim 1 wherein the synchroniser is configured to detect a frame of a signal transmitted using an OFDM modulation scheme.

8. A receiver according to claim 1 wherein the AGC comprises a look-up table which stores gain values for the variable gain elements against indices.

9. A receiver according to claim 8 wherein the gain values stored in the look-up table are indexed in order of increasing gain.

* * * * *